United States Patent
Lin et al.

(10) Patent No.: US 7,382,451 B2
(45) Date of Patent: Jun. 3, 2008

(54) METHOD OF DEFECT INSPECTION

(75) Inventors: Long-Hui Lin, Hsin-Chu Hsien (TW); Chia-Yun Chen, Kao-Hsiung Hsien (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 400 days.

(21) Appl. No.: 10/904,873

(22) Filed: Dec. 1, 2004

(65) Prior Publication Data

US 2005/0248756 A1    Nov. 10, 2005

(30) Foreign Application Priority Data

May 10, 2004   (TW) ................. 93113094 A

(51) Int. Cl.
  *G01N 21/00* (2006.01)
(52) U.S. Cl. .................................. 356/237.5
(58) Field of Classification Search ............. 356/237.5
  See application file for complete search history.

(56) References Cited

U.S. PATENT DOCUMENTS

| | | | | |
|---|---|---|---|---|
| 4,886,412 A * | 12/1989 | Wooding et al. ....... 414/416.05 |
| 5,847,821 A * | 12/1998 | Tracy et al. ............. 356/237.1 |
| 5,909,276 A * | 6/1999 | Kinney et al. ........... 356/237.2 |
| 5,966,459 A * | 10/1999 | Chen et al. ................. 382/149 |
| 5,971,586 A * | 10/1999 | Mori .......................... 700/108 |
| 6,073,501 A * | 6/2000 | Rohner ...................... 73/865.8 |
| 6,341,241 B1 * | 1/2002 | Mugibayashi et al. ...... 700/110 |
| 6,360,133 B1 * | 3/2002 | Campbell et al. ........... 700/115 |
| 6,401,088 B1 * | 6/2002 | Jagadish et al. ................ 707/6 |
| 6,763,130 B1 * | 7/2004 | Somekh et al. ............. 382/145 |
| 6,975,920 B2 * | 12/2005 | Kahn et al. ................. 700/218 |
| 7,196,785 B2 * | 3/2007 | Nishiyama et al. ....... 356/237.4 |
| 2002/0165636 A1* | 11/2002 | Hasan ......................... 700/121 |
| 2007/0233404 A1* | 10/2007 | Lally et al. ................... 702/35 |

* cited by examiner

*Primary Examiner*—Patrick Connolly
*Assistant Examiner*—Jonathan Skovholt
(74) *Attorney, Agent, or Firm*—Winston Hsu

(57) ABSTRACT

A plurality of cassettes, each having a plurality of wafers respectively having a first defect information, is selected. Each of the cassettes is then assigned to a corresponding tool having at least one reaction chamber, and the wafers are substantially equally assigned to the reaction chambers. A first process is then performed on each of the wafers in the reaction chamber. Finally, a first defect inspection process is performed on each of the wafers.

6 Claims, 11 Drawing Sheets

| Tool / Cassette | 100a | 100b | 100c |
|---|---|---|---|
| C'$_3$ | ✓ | | |
| C'$_5$ | | ✓ | |
| C'$_6$ | | | ✓ |
| C'$_{10}$ | ✓ | | |

Fig. 10

| Process\Cassette | $R_1$ | $R_2$ | $R_3$ |
|---|---|---|---|
| $W_1$ | ✓ | | |
| $W_{10}$ | ✓ | | |
| $W_{20}$ | | ✓ | |
| $W_{24}$ | | | ✓ |

Fig. 11

METHOD OF DEFECT INSPECTION

BACKGROUND OF INVENTION

1. Field of the Invention

The present invention relates to a method of defect inspection, and more specifically, to an in-line defect inspection method for daily check.

2. Description of the Prior Art

In the semiconductor manufacturing, some tiny particles and defects, which frequently reduce the performance of integrated circuits, are sometimes formed during various processes unavoidably. Therefore, different inspections are performed on semiconductor devices during the production in order to adjust production parameters, ensuring the reliability and yield of manufacturing processes by preventing the appearances of defects.

Please refer to FIG. 1, which represents a flow chart of semiconductor manufacturing according to the prior art. As shown in FIG. 1, a plurality of cassettes, $C_1$, $C_2$ . . . to $C_{10}$, is provided, and each of the cassettes $C_1$ to $C_{10}$ comprises a plurality of wafers. Then the data of cassettes $C_1$ to $C_{10}$ is recorded in a process control server (not shown) by a process engineer, and the process control server activates the production procedure in which cassettes $C_1$ to $C_{10}$ are involved afterward. Based on the production procedure installed in the process control server, a plurality of processes $P_1$ to $P_n$ are performed on cassettes $C_1$ to $C_{10}$ to form various devices on surfaces of the wafers. Either one of processes $P_1$ to $P_n$ is a semiconductor process, such as a thin film deposition process, an ion implantation process, an etching process or a lithography process. In addition, as shown in FIG. 1, tools 10a and 10b are utilized to perform process $P_1$, tools 20a, 20b and 20c are utilized to perform process $P_2$, and tool 30a is utilized to perform process $P_n$.

Generally, each manufacturing tool has its inspection procedure, such as a daily check procedure, in order to maintain the reliability and stability of manufacturing processes it performs. Please refer to FIG. 2, which represents a flow chart of a daily check procedure. As shown in FIG. 2, the daily check procedure comprises the following steps of:

step 40: start;

step 42: provide a bare wafer W;

step 44: perform a defect inspection process on the bare wafer W to obtain a first defect inspection information with the locations and number of defects on the surface of the bare wafer W;

step 46: install the bare wafer W into a manufacturing tool needing to be inspected, such as tool 20a, and perform process $P_2$ on the bare wafer W;

step 48: perform a defect inspection process on the bare wafer W to obtain a second defect inspection information with the locations and number of defects on the surface of the bare wafer W;

step 50: compare the first defect inspection information with the second defect inspection information to determine whether the tool 20a can be used to perform process $P_2$, such as by determining whether the difference of the numbers of defects on the bare wafer W provided in the first and second defect inspection information is within an allowable specification, i.e. less or equal to 30; and step 52: end.

However, the cost of bare wafer, especially a 12" wafer, is so high that the production cost would be severely increased if we use it for daily check. In addition, many integrated defects occur only after a series of processes and therefore can not be found on a bare wafer. As a result, the daily check procedure turns out to be ineffective. Moreover, the production tool, such as tool 20a, cannot simultaneously be inspected by the daily check procedure in FIG. 2 and perform manufacturing processes on product wafers. Therefore, in order to maintain the utilization of tool capacity at a certain level, the daily check procedure is rarely daily performed, leading to a inefficient monitor of the tool.

In addition to the inspection towards the tool, some defect inspection processes, such as defect inspection processes $D_1$ and $D_2$ shown in FIG. 1, are optionally performed to inspect the manufacturing processes in FIG. 1, ensuring the stability of the semiconductor manufacturing as well as the reliability of the product. Moreover, some cassettes among the cassettes $C_1$ to $C_{10}$, such as cassettes $C_3$, $C_5$, $C_6$ and $C_{10}$ in FIG. 1 for instance, are selected by the process control server as sampling cassettes to form a sample lot prior to the performance of the manufacturing processes on the cassettes $C_1$ to $C_{10}$, wherein wafers comprised in each of the sample cassettes are utilized to perform the in-line defect inspection method. Please refer to FIG. 3, which represents the flow chart of an in-line defect inspection method towards a manufacturing process, such as the process $P_2$ in FIG. 1, according to the prior art. As shown in FIG. 3, the in-line defect inspection method according to the prior art comprises the following steps of:

step 60: start;

step 62: receive a sampling cassette (for example, sampling cassette $C_3$);

step 64: randomly install sampling cassette $C_3$ into either one of the tools 20a, 20b or 20c and performing the process $P_2$ on each of the wafers in the sampling cassette $C_3$;

step 66: perform the defect inspection processes $D_2$ on portions of the wafers in the sampling cassette $C_3$ and determine whether the characteristics of defects found on the inspected wafers, such as the number of defects, are within an allowable specification, less than 100 for instance, in order to subsequently proceed either step 68, if the characteristics of defects found on the inspected wafers are within the allowable specification, or step 70, if the characteristics of defects found on the inspected wafers are out of the allowable specification;

step 68: perform a subsequent manufacturing process;

step 70: inform process engineers responsible for process $P_2$; and step 72: end.

As shown in FIG. 3, the operators randomly install the sampling cassettes $C_3$, $C_5$, $C_6$ and $C_{10}$, one at a time, into one or more not-in-production tools among tools 20a, 20b and 20c at the time of the installation. As a result, some tools may not be installed with any sampling cassette and therefore are not inspected. For example, tools 20a and 20b may be excluded from the defect inspection process in case that all of the sampling cassettes $C_3$, $C_5$, $C_6$ and $C_{10}$ are installed into tool 20c as a result of a coincidence.

An alternative solution to eliminate the disadvantage of the in-line defect inspection method revealed in FIG. 3 frequently adopted by operators is to perform a daily check by using product wafers. Please refer to FIG. 4, which represents the flow chart of the daily check by using product wafers according to the prior art. As shown in FIG. 4, the daily check comprises the following steps of:

step 80: start;

step 82: randomly select an in-line cassette, i.e., cassette $C_1$;

step 84: install the cassette $C_1$ into a tool waiting for inspection, for example, tool 20a, and performing process $P_2$ on each of the wafers in the cassette $C_1$;

step 86: perform a defect inspection process on portions of the wafers in the cassette $C_1$ and determine whether the characteristics of defects found on the inspected wafers, such as the number of defects, are within an allowable specification, less than 100 for instance, in order to subsequently proceed either step 88, if the characteristics of defects found on the inspected wafers are within the allowable specification, or step 90, if the characteristics of defects found on the inspected wafers are out of the allowable specification;

step 88: perform a subsequent manufacturing process;

step 90: inform process engineers responsible for process $P_2$; and step 92: end.

Generally, operators randomly choose two cassettes everyday to perform the daily check revealed in FIG. 4 on each of the tools utilized in semiconductor manufacturing. However, the chosen cassettes sometimes do not contain the defect information about previous processes since they are not necessarily sampling cassettes. Therefore, operators need to use a detector, such as a scanning electron microscopy (SEM), to analyze defects in order to determine whether the inspected tool is abnormal. The yield rate may be lowered due to inadequate judgment of operator towards the inspected tool caused by the improper operation of the SEM. Moreover, the methods in FIG. 3 and FIG. 4 are performed by utilizing product wafers, which frequently leads to redundant inspection efforts. As a result, the production lead-time and labor cost are both increased.

SUMMARY OF INVENTION

It is therefore a primary object of the present invention to provide a defect inspection method to integrate daily check into in-line manufacturing processes without increasing the labor cost and production lead-time.

In a preferred embodiment of the claimed invention, a dispatching process is initialized by selecting a plurality of cassettes, each of which comprising a plurality of wafers, wherein each wafer comprises a first defect information. Each of the cassettes is then assigned to a corresponding tool, and each the wafers in each cassette is further equally assigned to the chambers of the tool to ensure that each reaction chamber of each tool is assigned with at least one wafer. A first process is performed on each of the wafers in the reaction chambers thereafter. Finally, a first defect inspection process is performed on each of the wafers.

It is an advantage of the present invention against the prior art that the daily check in the prior art is integrated into the in-line defect inspection process, enabling operators to quickly respond to any abnormality of either the processes or the tools. In addition, by eliminating the manual inspection procedures in the prior art, not only the consumption of monitor wafers with high material cost is reduced, but inadequate operation of the tools by the operators frequently caused by the switches between manual and automatic operating modes is also prevented. Moreover, the defect inspection method in the present invention avoids redundant inspection efforts towards the wafers under production. Consequently, the manufacturing efficiency is increased as well.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

Figure 10:
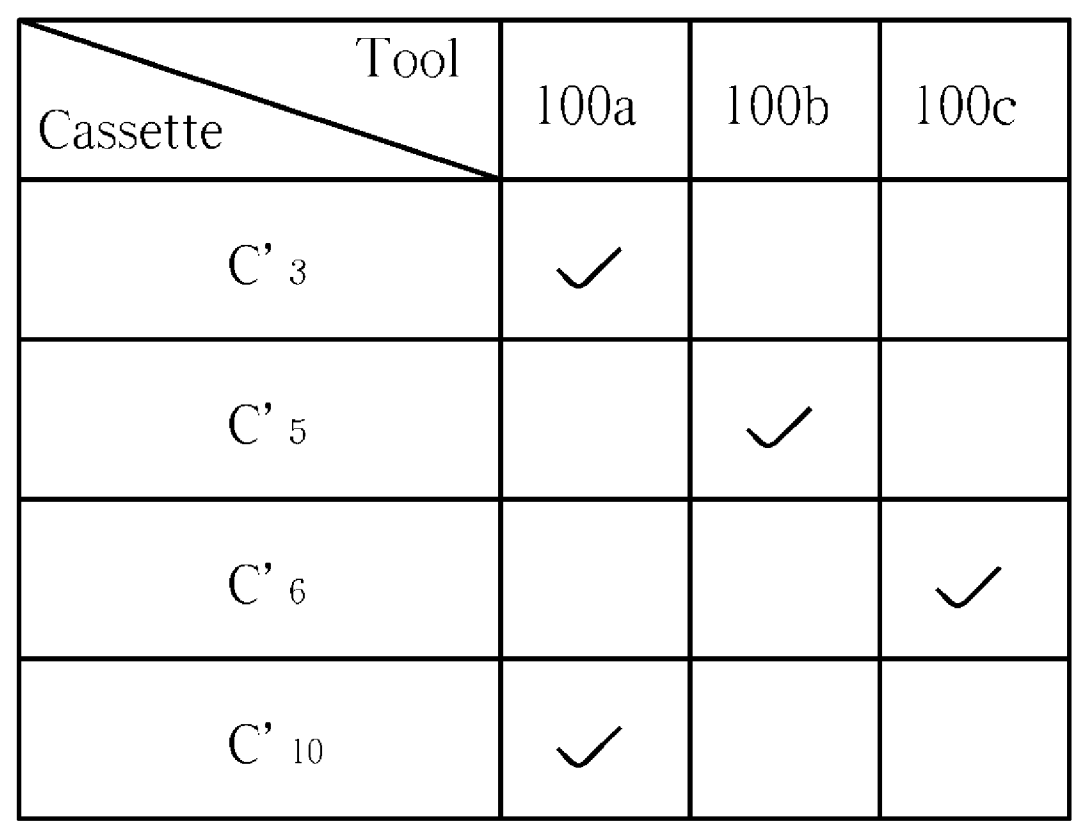

FIG. 10 is an allocation table of the sampling cassettes to tools according to the present invention.

Figure 11:
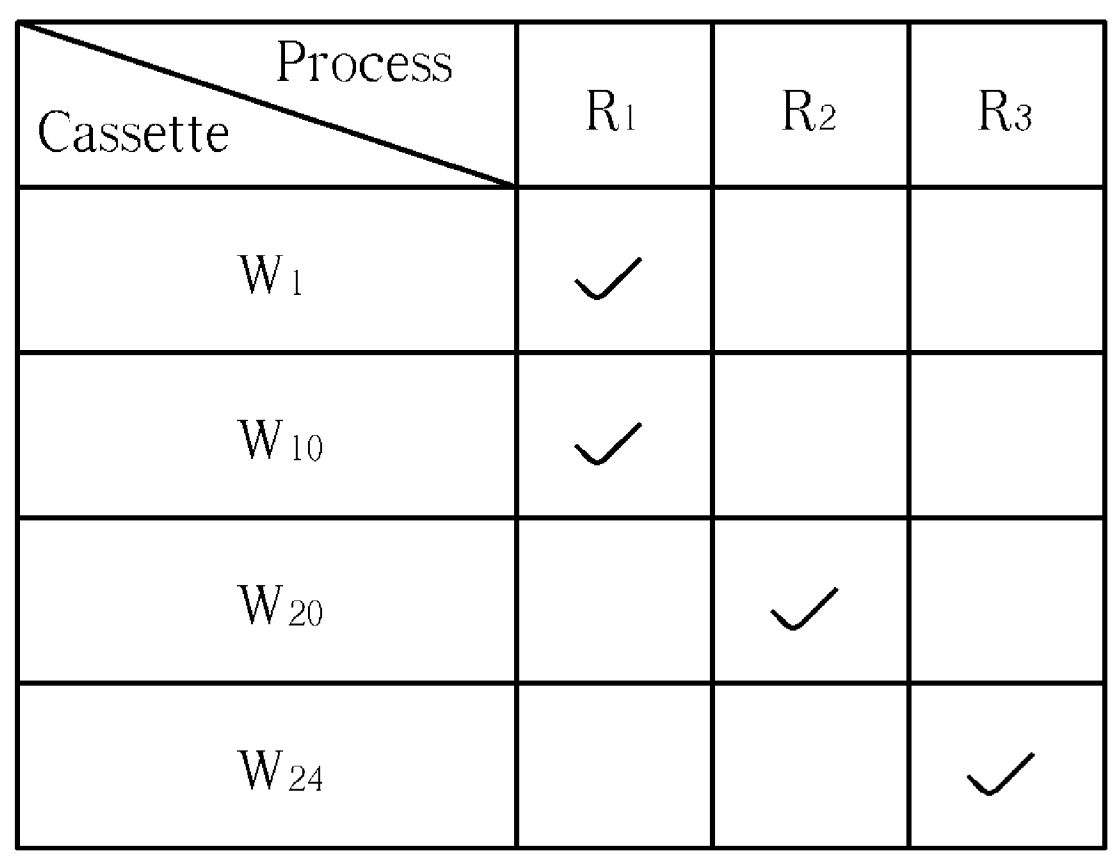

FIG. 11 is the allocation table of the sampling wafers to reaction chambers according to the present invention.

DETAILED DESCRIPTION

Figure 5:
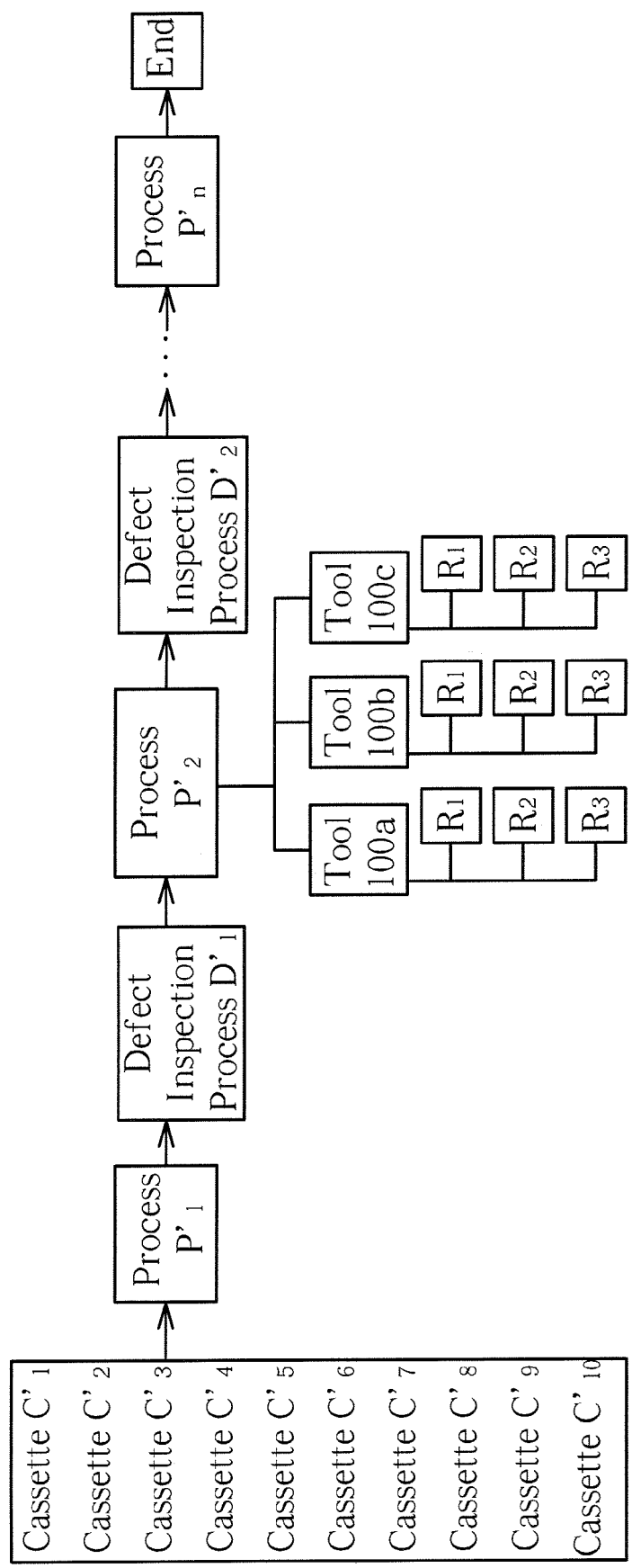
FIG. 5 is the flow chart of semiconductor manufacturing according to the present invention.

Please refer to FIG. 5, which is a flow chart of semiconductor manufacturing according to the present invention. As shown in FIG. 5, a plurality of cassettes, cassettes $C'_1$ to $C'_{10}$ for instance, is provided, and each of the cassettes $C'_1$ to $C'_{10}$ comprises 25 wafers, wafers $W_1$ to $W_{25}$. Then the information of cassettes is $C'_1$ to $C'_{10}$ input into a process control server (not shown) by a process engineer, and several cassettes and wafers are selected as sampling cassettes and sampling wafers, respectively. For example, the cassettes $C'_3$, $C'_5$, $C'_6$ and $C'_{10}$ are selected to be the sampling cassettes, and the wafers $W_1$, $W_{10}$, $W_{20}$ and $W_{24}$ in each of the sampling cassettes are selected to be the sampling wafers. A plurality of processes $P'_1$ to $P'_n$ are performed on the cassettes $C'_1$ to $C'_{10}$ thereafter according to an automatic manufacturing schedule installed in the process control server, so as to form various devices on each of the wafers in the cassettes $C'_1$ to $C'_{10}$, such as metal-oxide semiconductor transistors (MOS transistors) and dynamic random access memories (DRAMs). Generally, either one of the process $P'_1$ to $P'_n$ is a frequently adopted process, including a thin film deposition process, an ion implantation process, an etching process, a lithography process or any other semiconductor manufacturing process. In order to increase production yield rate, each of the processes $P'_1$ to $P'_n$ is capable of being performed by utilizing multiple production tools, each of which comprises at least one reaction chamber employed for various processes. For instance, the process $P'_2$ may be performed on the wafers by using tools 100a, 100b and 100c, each of which comprises reaction chambers $R_1$, $R_2$ and $R_3$. In addition, a defect inspection process, such as a defect inspection process $D'_1$ or a defect inspection process $D'_2$ shown in FIG. 5, is performed on the sampling wafers in the sampling cassettes after one or several manufacturing processes are performed, so as to monitor the stability of each process and each tool by collecting and analyzing the defect information on surfaces of the sampling wafers. Generally, the defect inspection process is performed within a defect inspector, such as AIT XP produced by KLA-Tencor.

Figure 6:
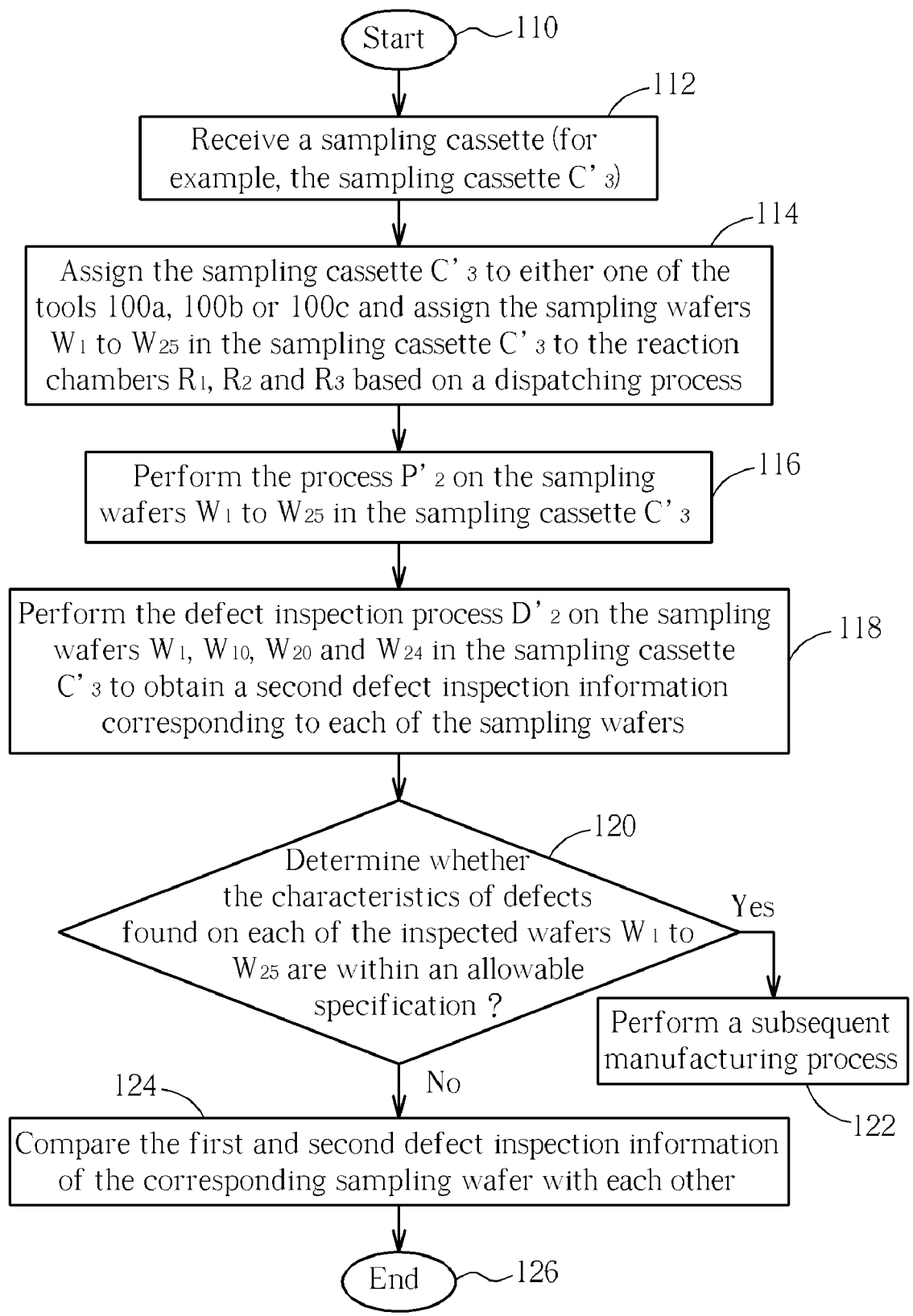
FIG. 6 is the flow chart of a defect inspection method according to a preferred embodiment of the present invention.

Please refer to FIG. 6, which represents the flow chart of the defect inspection method according to a preferred embodiment of the present invention. Although the defect inspection method revealed in the present invention is applicable to various semiconductor manufacturing processes and the tools employed thereby, only the process P'$_2$ and the tools 100a, 100b and 100c in FIG. 5 are illustrated in FIG. 6 to demonstrate the defect inspection method of the present invention for simplicity of description. As shown in FIG. 6, the defect inspection process D'$_1$ is performed on sampling cassettes C'$_3$, C'$_5$, C'$_6$ and C'$_{10}$ after the performance of the process P'$_1$, to obtain a first defect inspection information corresponding to each of the sampling wafer in the sampling cassettes. The first defect inspection information comprises data of the defects found on the surface of the corresponding sampling wafers, such as the number and location of the found defects in a format of either coordination or an image.

As shown in FIG. 6, the defect inspection method according to the present invention comprises the following steps of:

step 110: start;

step 112: receive a sampling cassette (for example, the sampling cassette C'3);

step 114: assign the sampling cassette C'3 to either one of the tools 100a, 100b or 100c and assigning the sampling wafers W1 to W25 in the sampling cassette C'3 to the reaction chambers R1, R2 and R3 based on a dispatching process;

step 116: perform the process P'2 on the sampling wafers W1 to W25 in the sampling cassette C'3;

step 118: perform the defect inspection process D'$_2$ on the sampling wafers W$_1$, W$_{10}$, W$_{20}$ and W$_{24}$ in the sampling cassette C'$_3$ to obtain a second defect inspection information corresponding to each of the sampling wafers;

step 120: determine whether the characteristics of defects found on each of the inspected wafers W$_1$, W$_{10}$, W$_{20}$ and W$_{24}$, such as the number of defects, are within an allowable specification, less than 100 for instance, in order to subsequently proceed either step 122, if the characteristics of defects found on the inspected wafers are within the allowable specification, or step 124, if the characteristics of defects found on the inspected wafers are out of the allowable specification;

step 122: perform a subsequent manufacturing process;

step 124: compare the first and second defect inspection information of the corresponding sampling wafer with each other by, for instance, utilizing a computer system to overlap the first and second defect inspection information; and step 126: end.

As mentioned in preceding paragraphs, the first defect inspection information is obtain after the performance of the process P'$_1$, and the second defect inspection information is obtain after the performance of the process P'$_2$. By comparing the first and second defect inspection information to find out the differences in between, operators can easily estimate the performance and stability of the process P'$_2$ and the tool utilized. As a result, the operator can quickly respond to any abnormal situation of the process P'$_2$ and the tool utilized.

Figure 7:
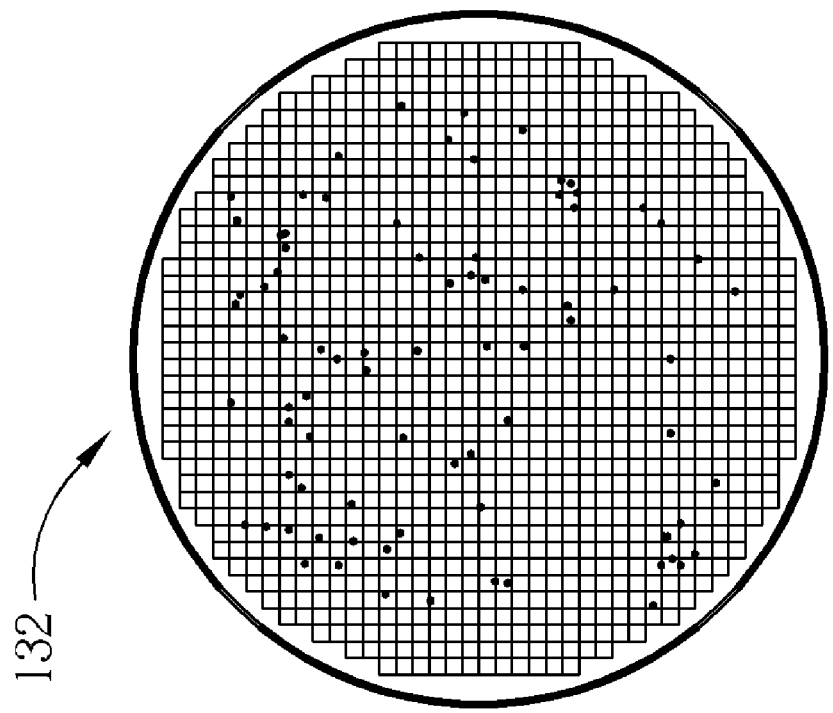
FIG. 7 is a schematic diagram of a first defect inspection information 130 and a second defect inspection information 132.
Figure 7:
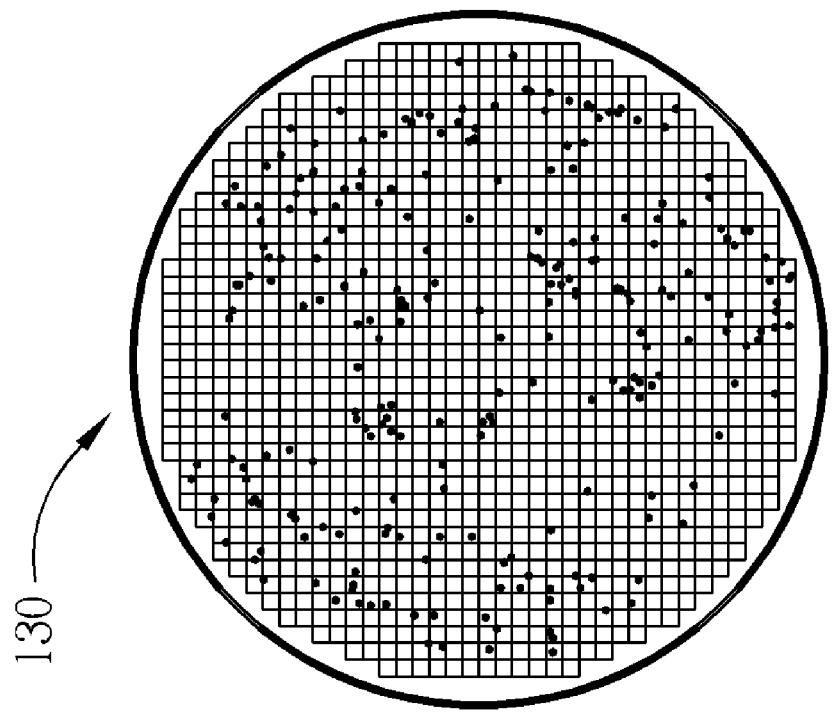
Figure 8:
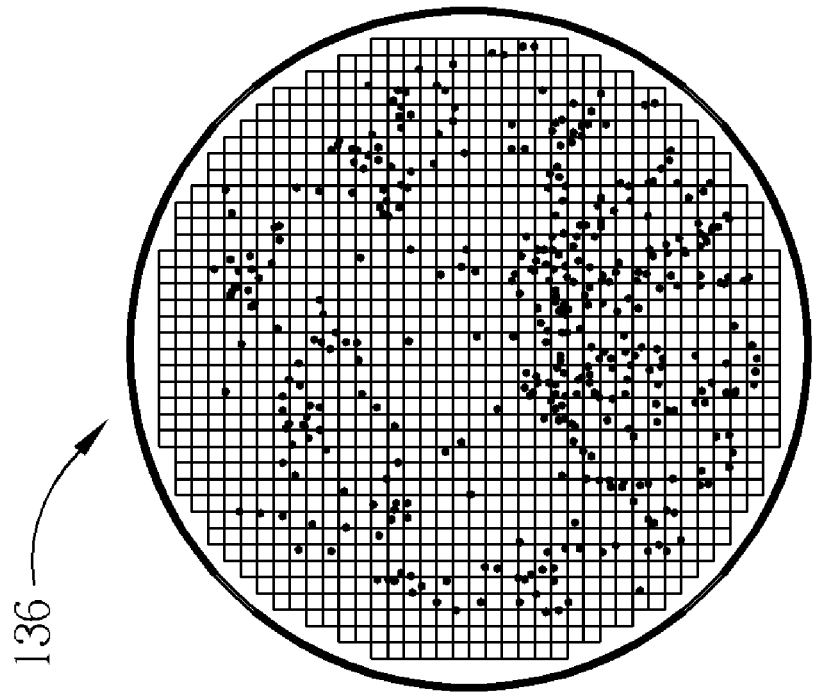
FIG. 8 is the schematic diagram of a first defect inspection information 134 and a second defect inspection information 136.
Figure 8:
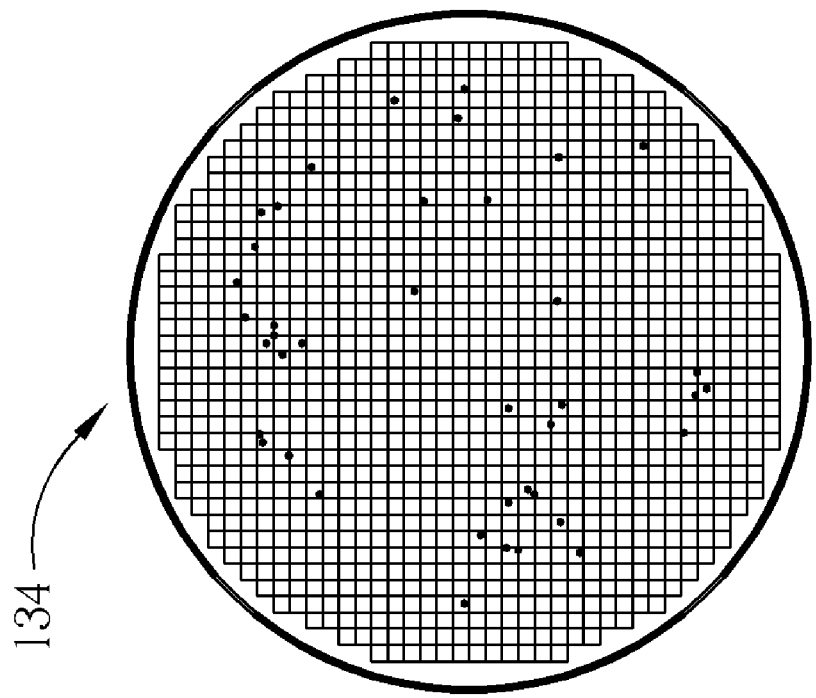

Moreover, the operator may further analyze the differences between the first and second defect inspection information to identify the sources of the abnormality of the process P'$_2$ and the tool utilized. Please refer to FIG. 7 and FIG. 8. FIG. 7 is a schematic diagram of a first defect inspection information 130 and a second defect inspection information 132, and FIG. 8 is the schematic diagram of a first defect inspection information 134 and a second defect inspection information 136. As shown in FIG. 7, the number of defects in the second defect inspection information 132 is significantly less than that in the first defect inspection information 130. This indicates that defects formed prior to the performance of the process P'$_2$ tend to be non-killer defects. A review towards the process P'$_2$ can be therefore neglected. As shown in FIG. 8, however, the number of defects in the second defect inspection information 136 is significantly greater than that in the first defect inspection information 134, and most of the locations of the defects shown in the second defect inspection information 136 are obviously different from those shown in the first defect inspection information 134. This implies an abnormality of the process P'$_2$, and the review towards the process P'$_2$ is therefore necessary. Generally, a scanning electron microscopy (SEM) is further utilized to observe the defects on the sampling wafers during a further analysis employed to find out the causes of the abnormality of the process P'$_2$.

Figure 9:
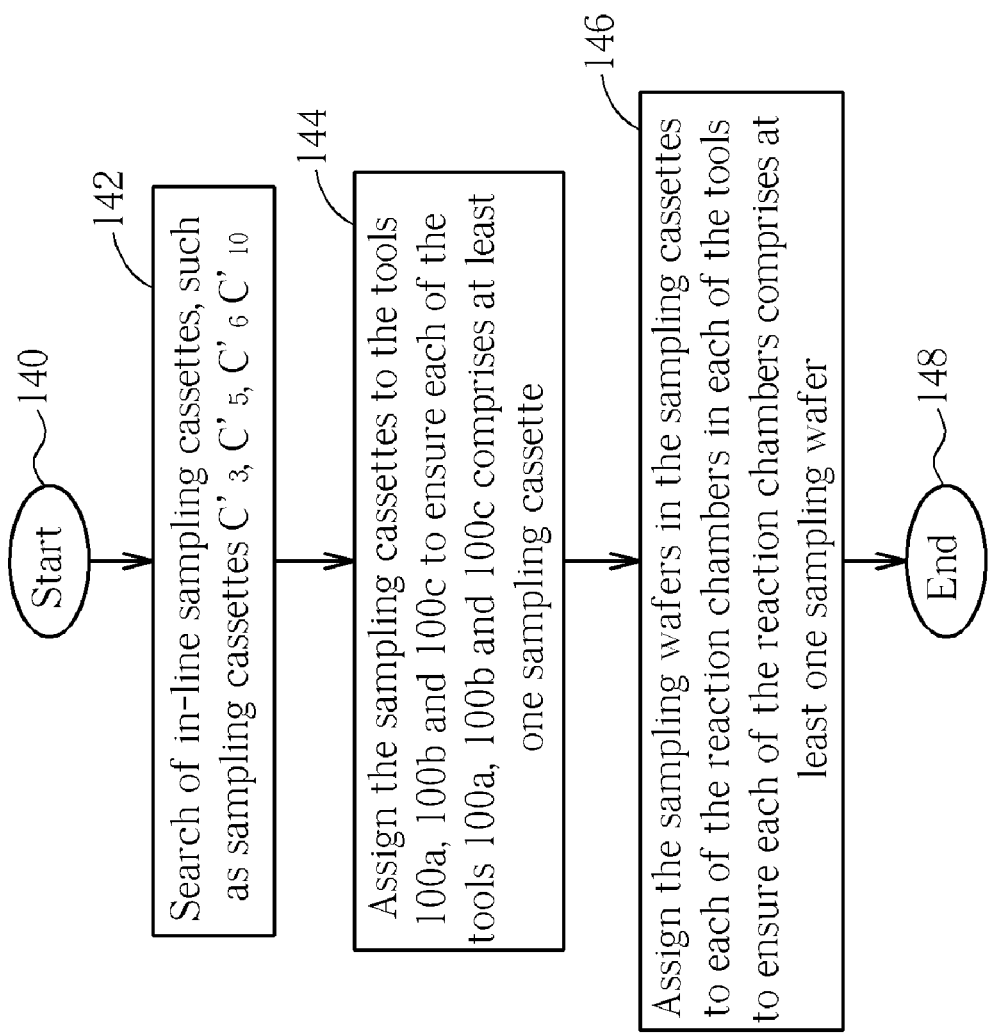
FIG. 9 is the flow chart of a dispatching process according to the present invention.

It is noticeable that the dispatching process in the present invention is employed to equally assign the sampling cassettes and the sampling wafers therein to each of reactions chambers in each of the tools substantially, ensuring a more efficient defect inspection towards all the manufacturing processes P'$_1$ to P'$_n$ and the tools employed. Please refer to FIG. 9, which is the flow chart of the dispatching process according to the present invention. As shown in FIG. 9, the dispatching process comprises the following steps of:

step 140: start;

step 142: search of in-line sampling cassettes, such as sampling cassettes C'$_3$, C'$_5$, C'$_6$ C'$_{10}$;

step 144: assign the sampling cassettes to the tools 100a, 100b and 100c to ensure each of the tools 100a, 100b and 100c comprises at least one sampling cassette, as shown in an example illustrated in FIG. 10 of an allocation table of the sampling cassettes, demonstrating the allocation of the sampling cassettes C'$_3$ and C'$_{10}$, C'$_5$, and C'$_{10}$ respectively to the tools 100a, 100b and 100c;

step 146: assign the sampling wafers in the sampling cassettes to each of the reaction chambers in each of the tools to ensure each of the reaction chambers comprises at least one sampling wafer, as shown in an example illustrated in FIG. 11 of the allocation table of the sampling wafers, demonstrating the allocation of the sampling wafers W$_1$ and W$_{10}$, W$_{20}$, and W$_{24}$ in the sampling cassette C'$_3$ respectively to the reaction chambers R$_1$, R$_2$ and R$_3$ of the tool 100a; and step 148: end.

Since the dispatching process is employed in the present invention to evenly assign sampling cassettes C'$_3$, C'$_5$, C'$_6$ C'$_{10}$ to the tools 100a, 100b and 100c and equally assign sampling wafers W$_1$ and W$_{10}$, W$_{20}$, and W$_{24}$ to the reaction chambers R$_1$, R$_2$ and R$_3$ of the sampling tools substantially, abnormality of each of the reaction chambers in each of the tools 100a, 100b and 100c is easily found by comparing the first and second defect inspection information obtained after the performance of the defect inspection process D'$_2$ on the sampling wafers. In other words, the defect inspection method in the present invention is capable of inspecting each reaction chamber in each tool. This combines the advantages of the in-line defect inspection process and the daily check in the prior art, integrating daily check into automatic manufacturing processes.

Figure 1:
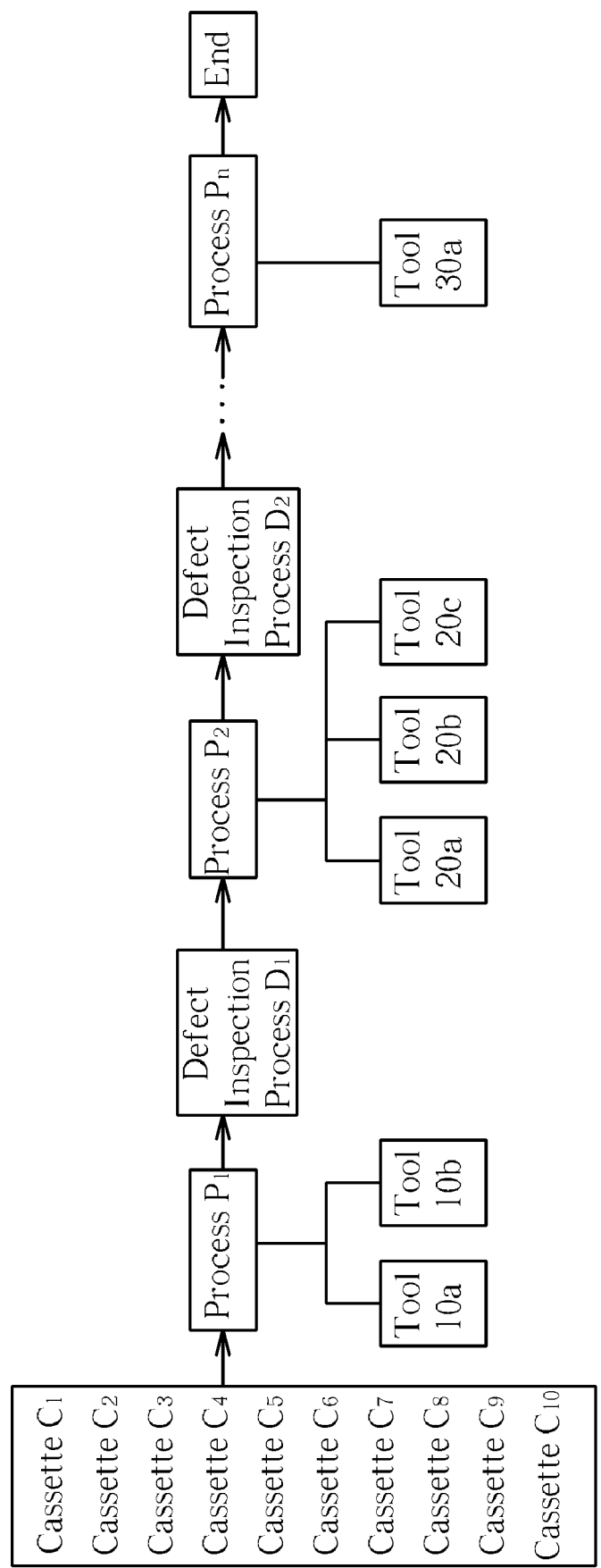
FIG. 1 is a flow chart of semiconductor manufacturing according to the prior art.
Figure 2:
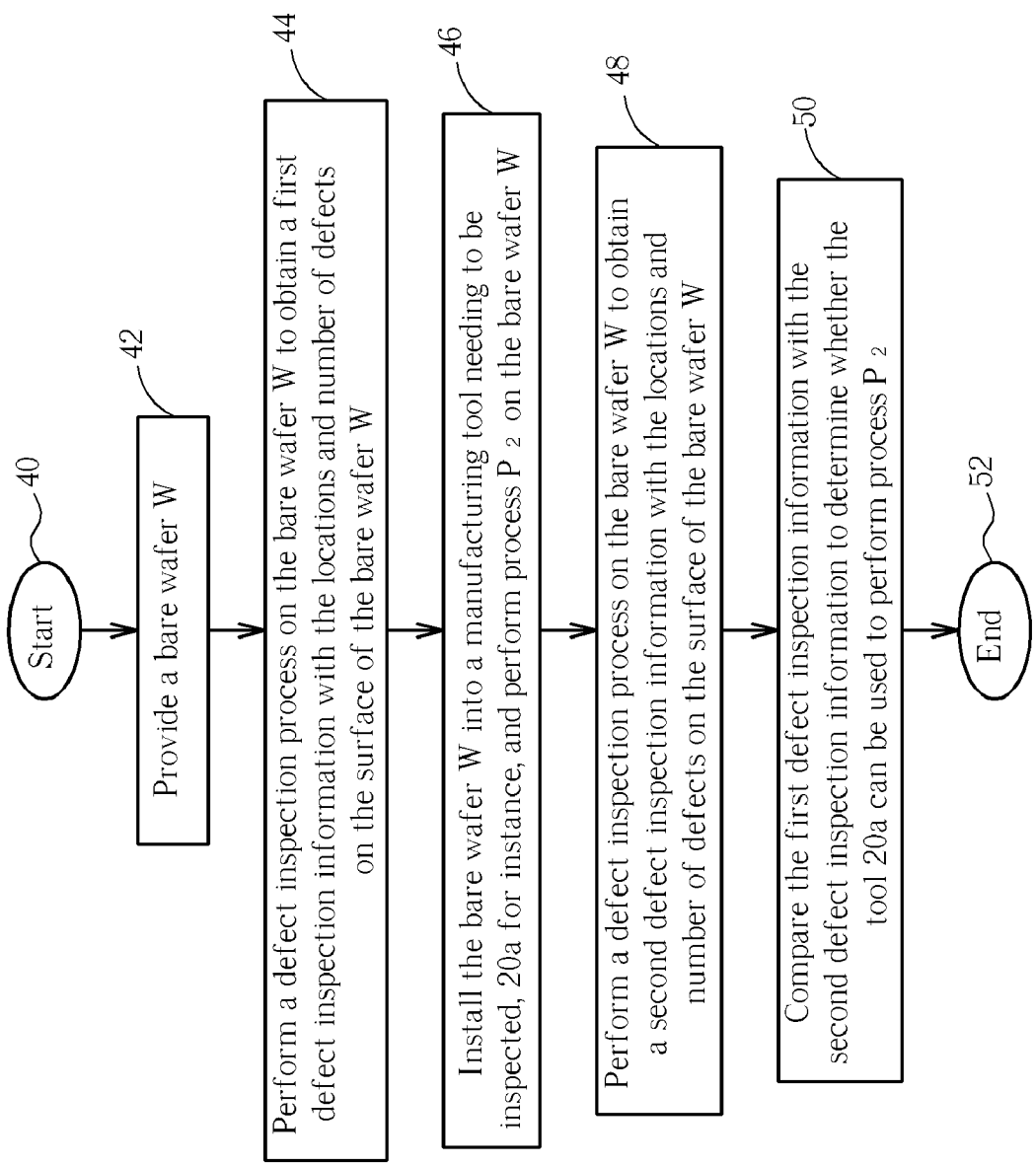
FIG. 2 is the flow chart of a daily check procedure according to the prior art.
Figure 3:
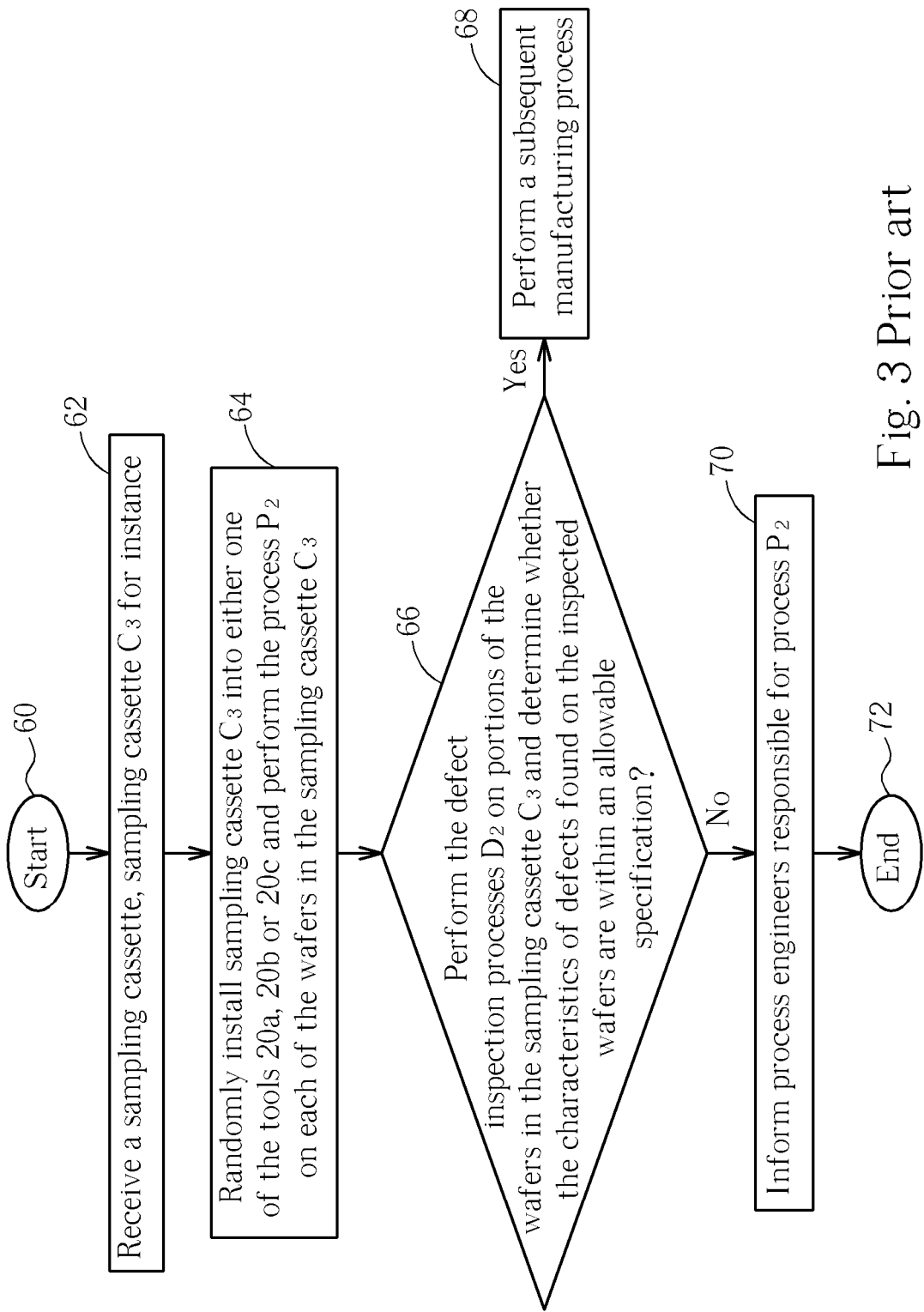
FIG. 3 is the flow chart of an in-line defect inspection method according to the prior art.
Figure 4:
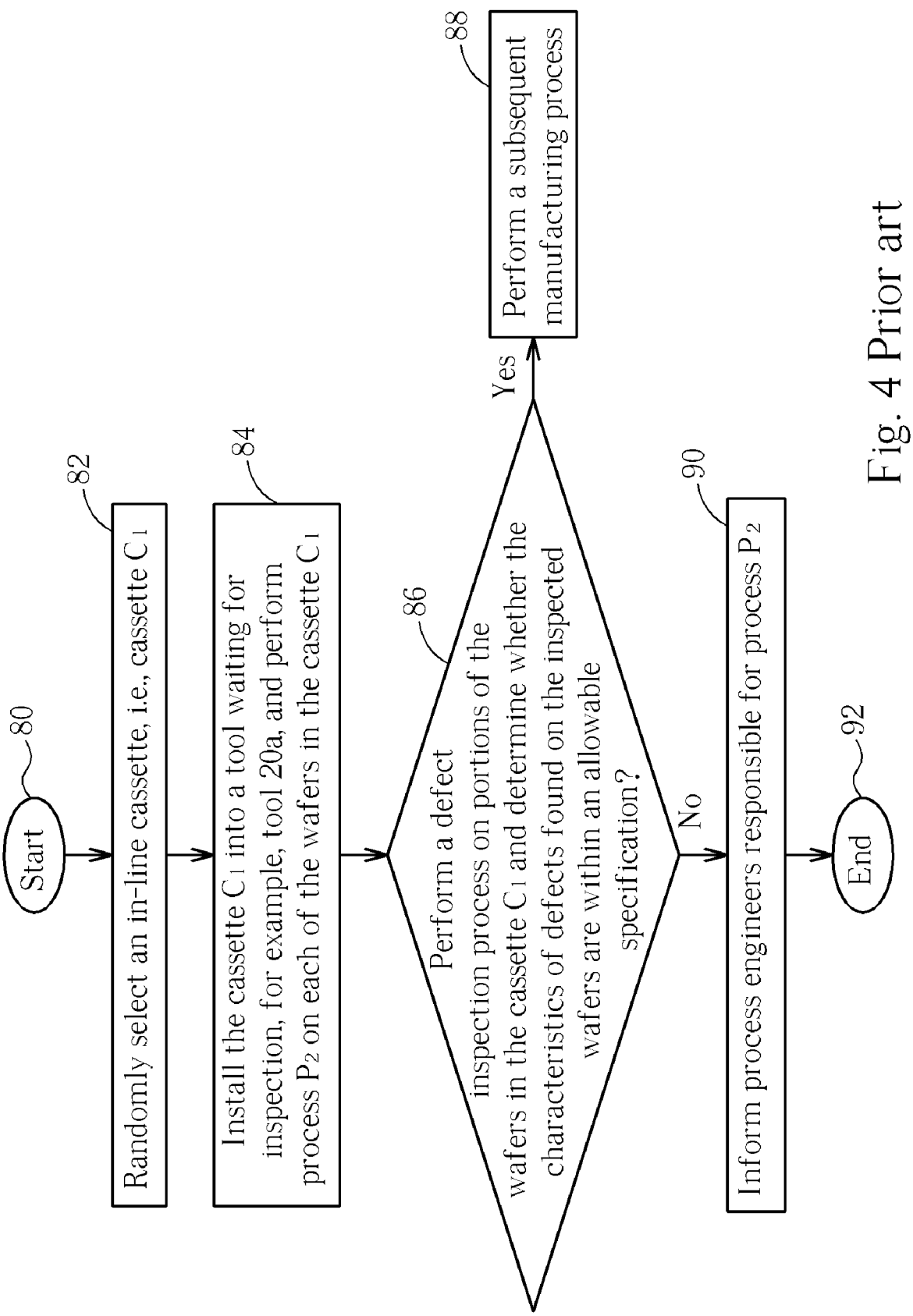
FIG. 4 is the flow chart of the daily check by using product wafers according to the prior art.

In addition, the integration of the daily check into automatic manufacturing processes mentioned in the previous paragraph eliminates the redundant manual defect inspection procedures described in FIG. 2 and FIG. 4 in the prior art, therefore reduce the consumption of monitor wafers and related material cost. Moreover, the production yield rate is secured in a certain level by preventing improper manual operation of the tools and frequent switches between manual and automatic operation modes. Another advantage of the present invention is to avoid redundant inspection as discussed in the prior art. As a result, the production efficiency is significantly improved. Generally, the ratio of the number of the sampling cassettes to that of all in-line cassettes ranges from ½ to ¼, assuring an increased inspection frequency that enables instant responses to any abnormality of either the processes or the tools.

Although the dispatching process in the present invention is illustrated by the limited numbers of sampling cassettes and sampling wafers in FIG. 10 and FIG. 11, it can be widely use on much more complicated production plans involving a huge amount of processes and tools. The allocation of the sampling cassettes and the sampling wafers can be adjusted based on different situation, as long as the sampling cassettes are evenly assigned to each of the tools and the sampling wafers are equally assigned to each of the reaction chambers substantially. In case that there is no in-line sampling cassettes available, operators may use the MFG control system to select eligible sampling cassettes and then perform the dispatching process in FIG. 9 to assign the selected cassettes to each of the tools.

The numbers of processes, tools, reaction chambers and cassettes described in preceding paragraphs can be adjusted based on different situation during the production. Similarly, the criteria for selecting sampling cassettes and sampling wafers can be adjusted based on the different requirements of the production and inspection as well.

In comparison with the prior art, the present invention integrates the daily check in the prior art into the in-line defect inspection process, therefore enabling operators to quickly respond to any abnormality of either the processes or the tools. In addition, by eliminating the manual inspection procedures in the prior art, not only the consumption of monitor wafers with high material cost is reduced, but inadequate operation of the tools by the operators frequently caused by the switches between manual and automatic operating modes is also prevented. The production yield rate is therefore significantly improved. Moreover, the defect inspection method in the present invention avoids redundant inspection efforts towards the wafers under production. Consequently, the manufacturing efficiency is increased as well.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of defect inspection for inspecting production errors of a plurality of tools, each tool comprising at least one reaction chamber, the method comprising:

performing a dispatching process comprising:

selecting a plurality of cassettes, each cassette comprising a plurality of wafers, each wafer comprising a first defect inspection information;

assigning each of the cassettes to a corresponding tool for ensuring each of the tools comprises at least one cassette; and assigning the wafers in the cassettes to each of the reaction chambers in each of the tools, respectively, for ensuring each of the reaction chambers comprises at least one wafer;

performing a first process on each of the wafers in the reaction chamber;

performing a first defect inspection process on each of the wafers, performing a first procedure prior to the first process, wherein the first procedure comprises:

performing a second process on each of the wafers; and performing a predetermined defect inspection process on the wafers to obtain the first defect inspection information, each of the first defect inspection information comprising the location and numbers of defects on the corresponding wafer;

performing the first defect inspection process on the wafers to obtain a second defect inspection information corresponding to each of the wafers, the second defect inspection information comprising at least the location and numbers of defects on the corresponding wafer, wherein upon when the number of defects in the second defect inspection information is significantly less than that in the first defect inspection information, the defects formed prior to the performance of the second process is thereby indicated to be non-killer defects, and a review towards the second process is thereby neglected; and upon when the number of defects in the second defect inspection information is significantly greater than that as in the first defect inspection information, and most of the locations of the defects shown in the second defect inspection information are different from those shown in the first defect inspection information, abnormality of the second process is thereby indicated.

2. The method of claim 1 wherein the method of defect inspection further comprises:

determining whether the second defect inspection information is within an allowable specification.

3. The method of claim 2 wherein the wafers with the second defect inspection information within the allowable specification is capable of being used for subsequent manufacturing processes.

4. The method of claim 2 wherein a comparing step is performed on the wafers with the second defect inspection information out of the allowable specification to compare the first defect information with the second defect inspection information of the corresponding wafer.

5. The method of claim 1 wherein each of the cassettes is a sampling cassette, each of the wafers is a sampling wafer, and each of the sampling wafers comprises a product wafer.

6. The method of claim 1 wherein either the first process or the second process comprises either a thin film deposition process, an ion implantation process, an etching process or a lithography process.

* * * * *